United States Patent
Wang et al.

(10) Patent No.: US 10,533,852 B1
(45) Date of Patent: Jan. 14, 2020

(54) LEVELING SENSOR, LOAD PORT INCLUDING THE SAME, AND METHOD OF LEVELING A LOAD PORT

(71) Applicant: Taiwan Semiconductor Manufacturing Company, Ltd., Hsinchu (TW)

(72) Inventors: Yi-Lin Wang, Kaohsiung (TW); Jung-Tang Wu, Kaohsiung (TW); Chin-Szu Lee, Taoyuan (TW); Hua-Sheng Chiu, Zhudong Town (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/275,994

(22) Filed: Feb. 14, 2019

Related U.S. Application Data

(60) Provisional application No. 62/737,606, filed on Sep. 27, 2018.

(51) Int. Cl.
| | |
|---|---|
| *G01C 9/06* | (2006.01) |
| *H01L 21/67* | (2006.01) |
| *H01L 21/677* | (2006.01) |
| *G01H 1/00* | (2006.01) |
| *G08B 21/18* | (2006.01) |

(52) U.S. Cl.
CPC ............ *G01C 9/06* (2013.01); *G01H 1/00* (2013.01); *G08B 21/182* (2013.01); *H01L 21/67196* (2013.01); *H01L 21/67201* (2013.01); *H01L 21/67259* (2013.01); *H01L 21/67276* (2013.01); *H01L 21/67778* (2013.01); *G01C 2009/066* (2013.01)

(58) Field of Classification Search
CPC .......... G01C 9/06; G01H 1/00; G08B 21/182; H01L 21/67201; H01L 21/67259; H01L 21/67778
USPC ........................................................ 340/669
See application file for complete search history.

(56) References Cited

U.S. PATENT DOCUMENTS

| | | | | |
|---|---|---|---|---|
| 6,732,442 B2* | 5/2004 | Wu | .................... | H01L 21/67772 33/502 |
| 7,100,340 B2* | 9/2006 | Bonora | .............. | H01L 21/67766 248/672 |
| 7,419,346 B2* | 9/2008 | Danna | ............... | H01L 21/67736 414/217 |
| 10,020,182 B2* | 7/2018 | Liu | ......................... | G01N 29/14 |
| 2008/0087116 A1* | 4/2008 | Rate | ......................... | G01P 15/08 73/865.9 |
| 2016/0370797 A1* | 12/2016 | Azarya | ............. | H01L 21/67253 |
| 2019/0019719 A1* | 1/2019 | Atwood | ............ | H01L 21/68707 |

* cited by examiner

*Primary Examiner* — John A Tweel, Jr.
(74) *Attorney, Agent, or Firm* — Slater Matsil, LLP

(57) ABSTRACT

A leveling sensor, a load port including a leveling sensor, and a method of leveling a load port using a load port are disclosed. In an embodiment, a sensor includes an accelerometer configured to detect leveling and vibration of a load port and produce a plurality of data; a plurality of indicator lights configured to display a level measurement and a level direction based on the leveling of the load port; a processor configured to process the data produced by the accelerometer; and a wired connection configured to connect the processor to an external device.

20 Claims, 9 Drawing Sheets

US 10,533,852 B1

LEVELING SENSOR, LOAD PORT INCLUDING THE SAME, AND METHOD OF LEVELING A LOAD PORT

PRIORITY CLAIM AND CROSS-REFERENCE

This application claims the benefit of U.S. Provisional Application No. 62/737,606, filed on Sep. 27, 2018, entitled "Load Port Leveling Sensor and Method of Using the Same," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

In order to process semiconductor devices, wafers on which the semiconductor devices are formed are transferred between various processing machines. During the transfer process, the wafers are secured in transport devices or pods. The wafers are moved from the transport pods to the processing machines using load ports, which automatically remove the wafers from the transport pods into the processing machines. Thus, the wafers are protected from exposure to contaminants, which might damage the semiconductor devices formed thereon.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
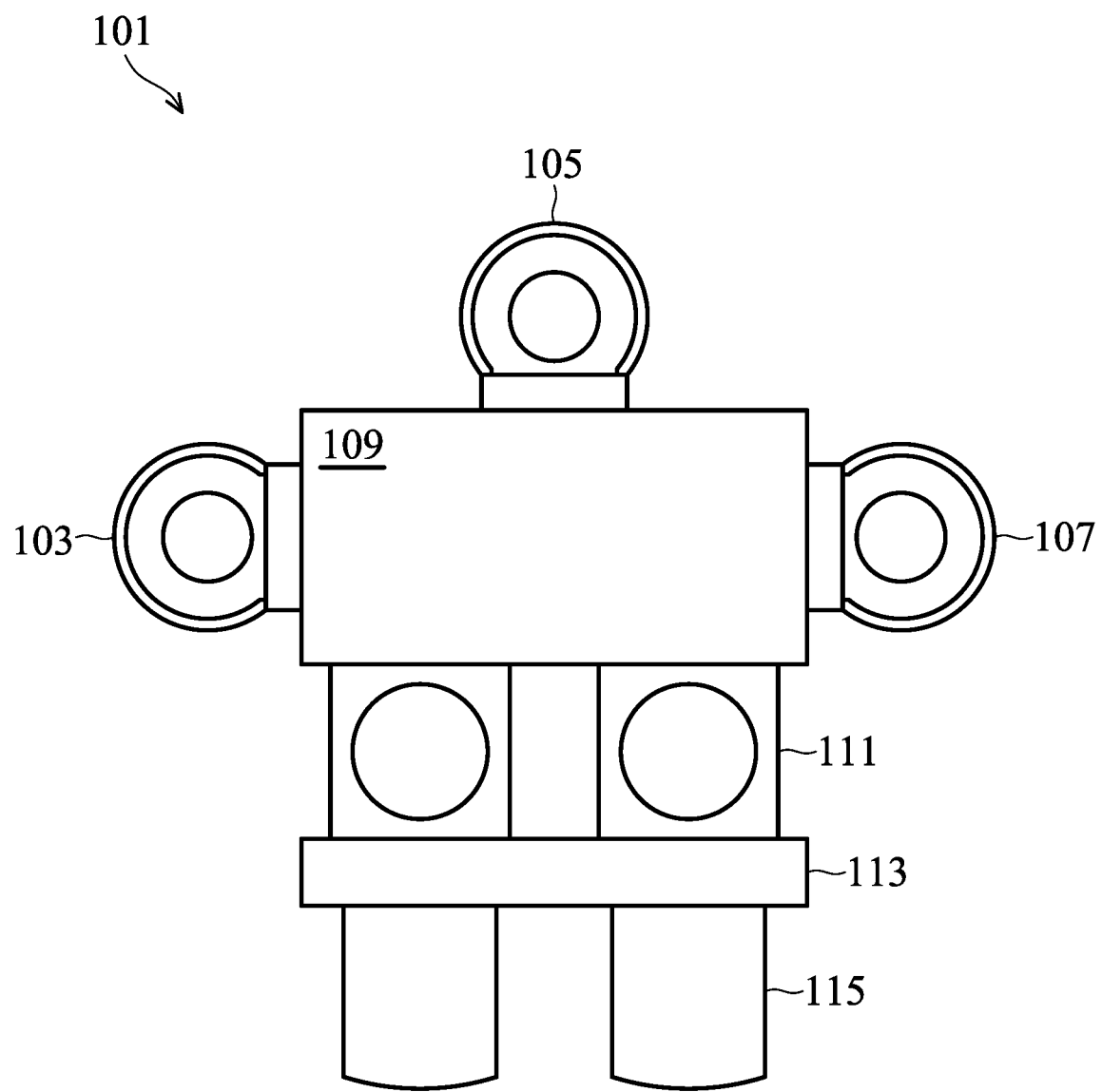
FIG. 1 illustrates a plan view of a semiconductor processing apparatus, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved sensors for determining whether a load port is level and whether vibration of the load port is excessive. The sensors include accelerometers, which determine whether there is movement or vibration of the load port and determine whether the load port is level. The sensors may provide visual, audio, and other warnings if the load port becomes out of level or vibrates excessively, thus these issues with the load port may be corrected. This helps to prevent defects caused by misalignment, excessive vibration, or the like of the load port and improves device yield for semiconductor wafers processed using load ports including the sensors.

Semiconductor devices are fabricated on semiconductor wafers by performing various processing steps, such as deposition, removal, patterning, electrical modification, and the like, on the semiconductor wafers. Semiconductor processing apparatuses are used to perform these processing steps on the semiconductor wafers. During this fabrication process, the semiconductor wafers are transported between various semiconductor processing apparatuses, which each perform different processing steps. Any contamination of the semiconductor wafers may cause defects in the semiconductor devices formed on the semiconductor wafers and can result in a drop in semiconductor device yield. As such, the semiconductor wafers are transported between the semiconductor processing apparatuses using transport pods, which have a controlled environment therein and prevent contamination of the semiconductor wafers. The semiconductor wafers are then transferred between the transport pods and the semiconductor processing apparatuses using load ports, which provide a controlled environment between the transport pod and the semiconductor processing apparatuses and prevent contamination of the semiconductor wafers during the process of transferring the semiconductor wafers between the transport pod and the semiconductor processing apparatuses. Misalignment of the load port, caused by, for example, the load port being unlevel, can compromise seals of the load port and allow contaminants to breach the load port and harm the semiconductor wafers.

Additionally, the semiconductor wafers can be bumped or scraped during the transportation process between semiconductor processing apparatuses, which may also cause defects in the semiconductor wafers and a semiconductor device yield drop. Unleveling of the load port and excessive vibration of the load port can both cause the semiconductor wafers to be bumped or scraped. As such, ensuring the load port is level and minimizing vibration of the load port serve to prevent defects in semiconductor wafers and increase semiconductor device yield.

FIG. 1 schematically illustrates a semiconductor processing apparatus 101 in accordance with an embodiment. The semiconductor processing apparatus 101 includes a first process chamber 103, a second process chamber 105, and a third process chamber 107 interconnected via a buffer chamber 109. One or more load lock chambers 111 are connected to the buffer chamber 109. The buffer chamber 109 and the load lock chambers 111 permit semiconductor wafers to be transferred between the first process chamber 103, the second process chamber 105, and the third process chamber 107 without breaking a vacuum between processes or chambers.

The semiconductor processing apparatus 101 may also include a transfer module 113 and load ports 115. The load ports 115, the transfer module 113, and the load lock chambers 111 allow semiconductor wafers to be loaded and unloaded from the semiconductor processing apparatus 101 without exposing the transfer module 113, the first process chamber 103, the second process chamber 105, or the third process chamber 107 to the ambient environment. The pressure of the load ports 115 may be about 1 atm, whereas the pressure of the buffer chamber 109 may be under a vacuum and may be much lower, such as less than about 10 Torr.

In operation, the semiconductor wafers are transferred into and out of the semiconductor processing apparatus 101, either individually or in batches, via the load ports 115. The semiconductor wafers are transferred from the load ports 115 to the load lock chambers 111 via the transfer module 113. Once transferred into the load lock chambers 111, the semiconductor wafers are isolated from the ambient environment. Typically, an inert gas such as nitrogen is purged through the load lock chamber 111, and the load lock chamber 111 is pumped down to a low pressure or a vacuum. The load lock chamber 111 may be pumped to a pressure ranging from about 1.5 Torr to about 7.5 Torr to remove any air from the load lock chamber 111. The semiconductor wafers are then transferred from the load lock chamber 111 to one or more of the first process chamber 103, the second process chamber 105, and the third process chamber 107, which may be pumped down to a similar pressure as that of the load lock chambers 111 such that the pressure of the first process chamber 103, the second process chamber 105, and the third process chamber 107 are in equilibrium with the pressure of the load lock chambers 111 through the transfer module 113.

The semiconductor wafers may be transferred from the load lock chambers 111 into a processing chamber, e.g., the first process chamber 103, the second process chamber 105, or the third process chamber 107, using a belt, a robotic arm, or another transfer mechanism (not separately illustrated). The first process chamber 103, the second process chamber 105, and the third process chamber 107 may be equipped with heating elements, gas flow orifices, radio frequency coils, and other equipment (not separately illustrated) necessary to affect the desired processing steps. Each of the first process chamber 103, the second process chamber 105, and the third process chamber 107 may be configured for the same process or different processes as desired. It should be noted that FIG. 1 illustrates a semiconductor processing apparatus 101 having three process chambers for illustrative purposes only. Other embodiments may include fewer or more process chambers.

In an embodiment, the semiconductor wafer is a semiconductor substrate. The semiconductor substrate may be a bulk silicon substrate, although it may include other semiconductor materials such as group III, group IV, and/or group V elements. In another embodiment, the semiconductor wafer is a semiconductor substrate on a carrier with a release layer between the semiconductor substrate and the carrier. The carrier may be a glass carrier, a ceramic carrier, or the like. The release layer may be formed of a polymer-based thermal release or thermosetting material, which can be removed to detach the semiconductor substrate from the carrier. In an embodiment, the release layer is formed of a polymer-based material such as epoxy, polyimide, ultraviolet (UV) light glue, or the like. The release layer may be applied as a liquid and cured. In alternative embodiments, the release layer is a laminate film that is laminated onto the carrier. In some embodiments, the semiconductor wafer includes passive and/or active devices, such as resistors and transistors. For example, the semiconductor wafer may be silicon substrate on a glass carrier with a release layer made from epoxy.

Figure 2A:
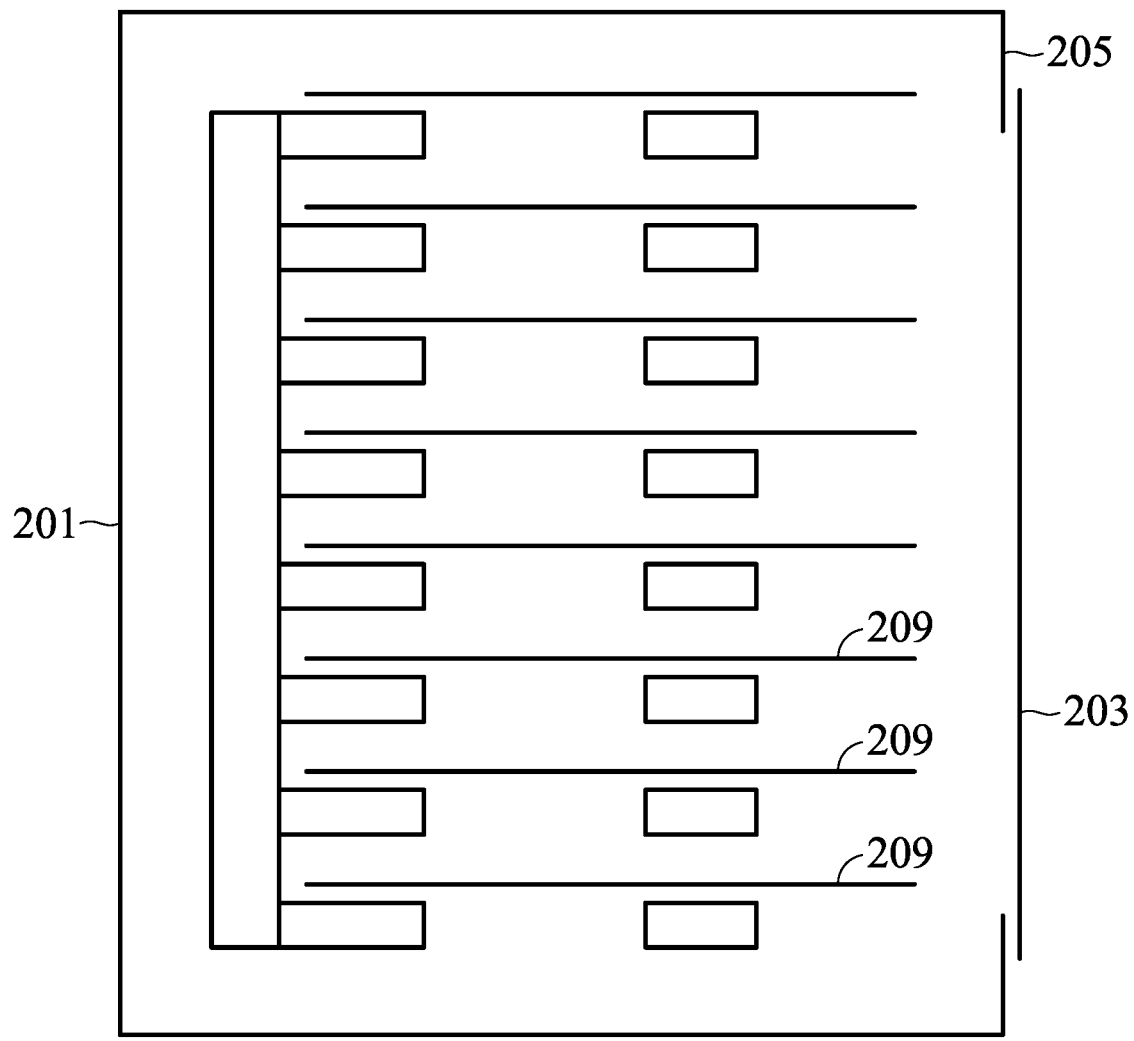
FIGS. 2A-2C illustrate a cross-sectional view, a perspective view, and a bottom-up view, respectively, of a semiconductor wafer transport pod, in accordance with some embodiments.
Figure 2C:
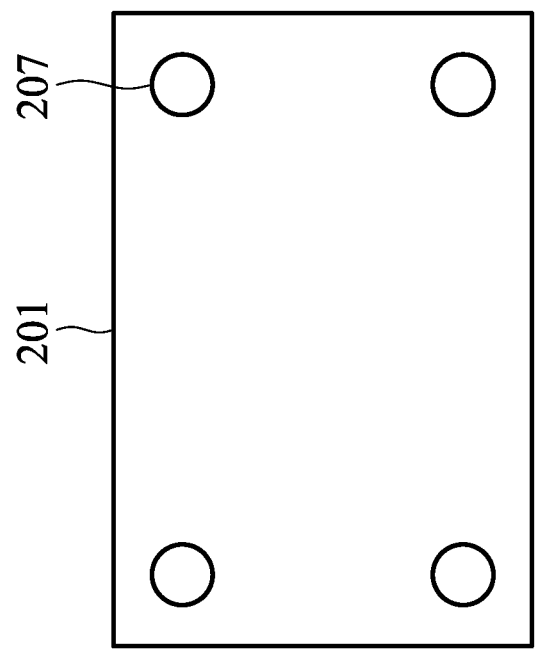
Figure 2B:
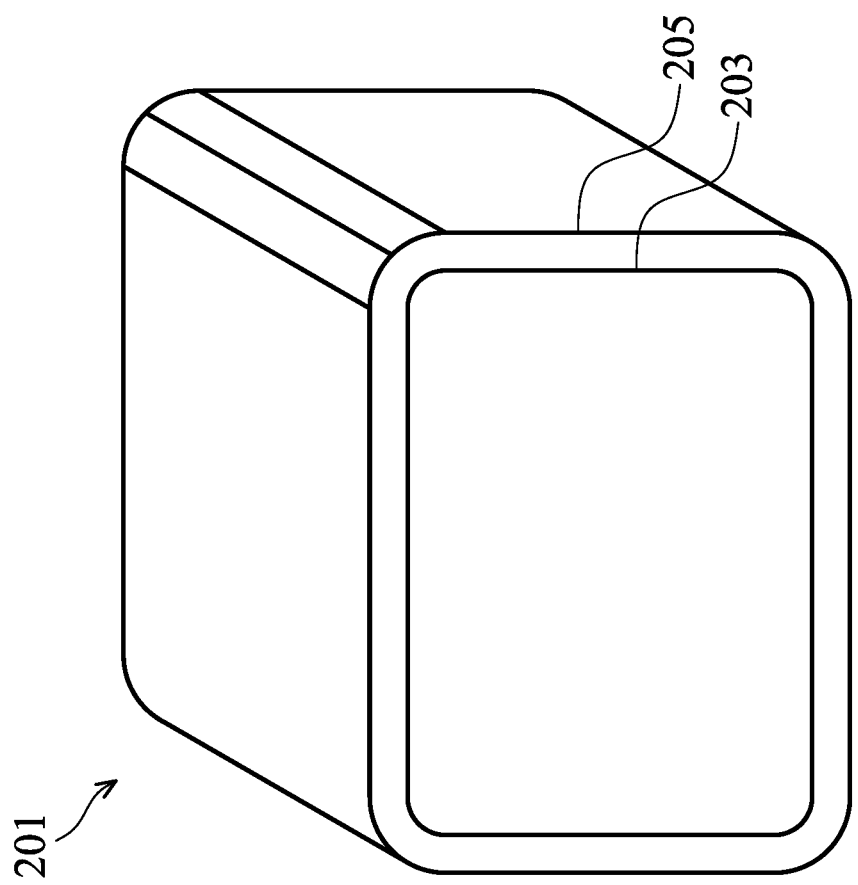

The semiconductor wafers are transported between the semiconductor processing apparatus 101 and other semiconductor processing apparatuses using transport pods. For example, FIGS. 2A-2C illustrate a cross-sectional view, a perspective view, and a bottom-up view, respectively, of a transport pod 201, which may be a front opening unified pod (FOUP), a front opening shipping box (FOSB), a cassette, or the like. The transport pod 201 is configured to store a plurality of semiconductor wafers 209 at the same time in an airtight environment such that the semiconductor wafers 209 may be transferred between the various semiconductor processing apparatuses.

In order to load and unload the semiconductor wafers 209 from the transport pod 201, a frame 205 of the transport pod 201 is sealed to a frame of a load port. Once the frame 205 is sealed to the load port, a transport pod door 203 of the transport pod 201, such as a front-opening door, is robotically opened and the semiconductor wafers 209 are loaded or unloaded from the transport pod 201. Once this process is complete, the transport pod door 203 is once again closed and sealed.

In accordance with some embodiments, the transport pod 201 may be sealed while storing the semiconductor wafers 209, in order to prevent any contamination of the semiconductor wafers 209 contained therein. The transport pod 201 may be filled with ambient air while storing the semiconductor wafers 209, which may be clean air at the pressure of one atmosphere. In accordance with alternative embodiments of the present disclosure, the transport pod 201 may be purged with nitrogen ($N_2$), which is substantially free from oxygen and moisture (for example, less than 1 volume percent, less than 0.1 percent, 0.01 percent, 0.001 percent, or lower). The transport pod 201 may be filled with nitrogen during the transportation of the transport pod 201 and while the semiconductor wafers 209 are stored therein. As illustrated in FIG. 2C, the transport pod 201 may include ports 207, which may be used to purge the transport pod 201 and/or fill the transport pod 201 with a gas, such as air, nitrogen, or the like. Purging the transport pod 201 with nitrogen gas or the like may be used to reduce humidity in the transport pod 201 and to increase Q-time (e.g., the maximum allowable time between semiconductor processes).

Figure 3B:
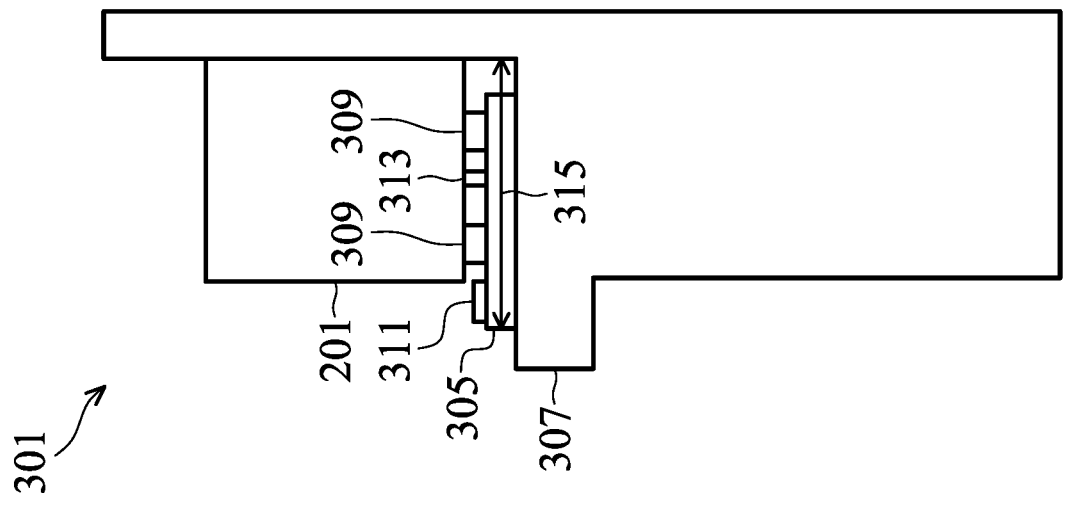
FIGS. 3A-3C illustrate a front view, a side view, and a top-down view, respectively, of a load port, in accordance with some embodiments.
Figure 3A:
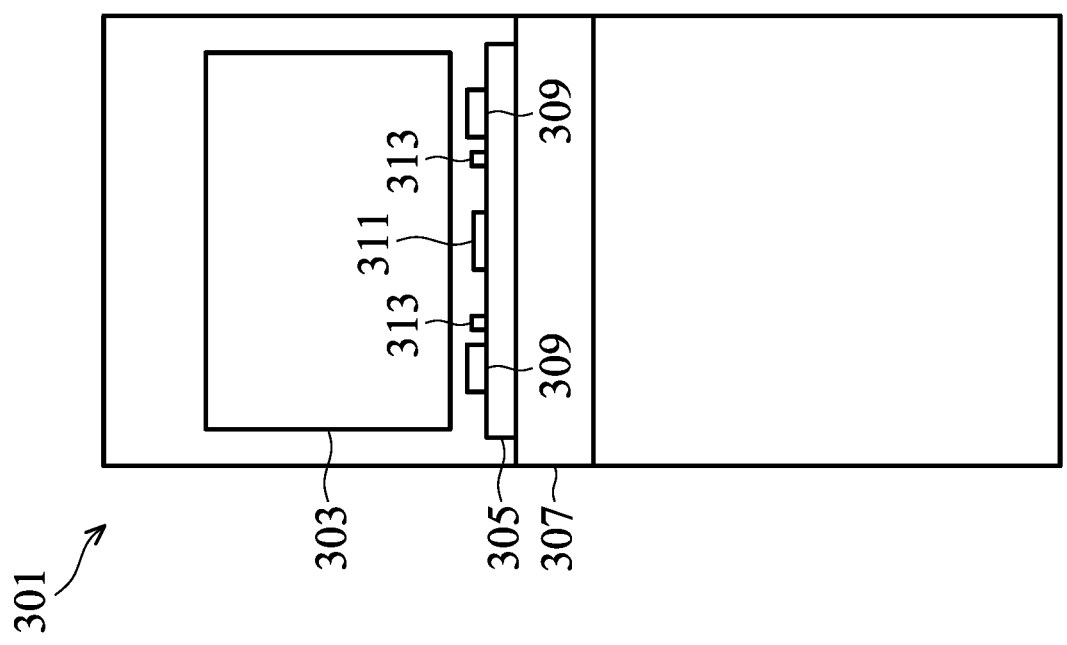
Figure 3C:
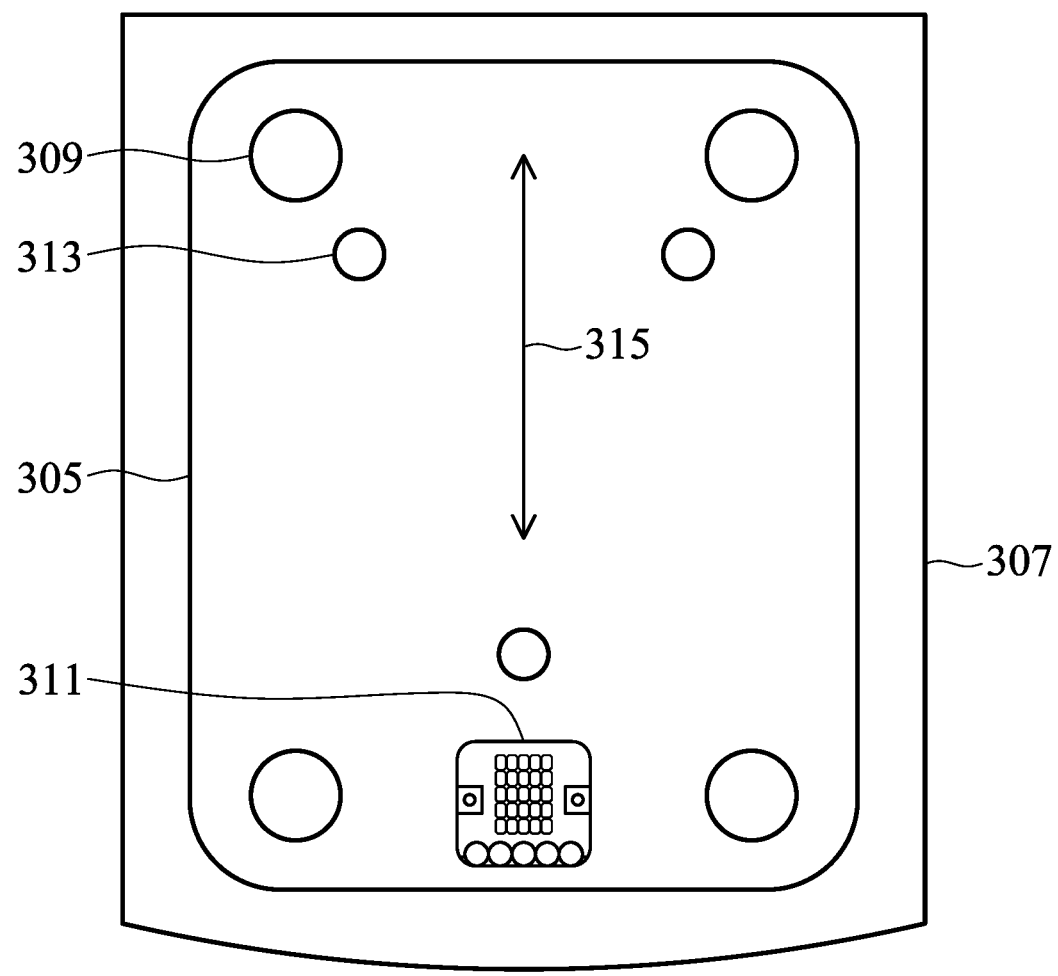

FIGS. 3A-3C illustrate a front-view and a side view of a load port 301 and a top-down view of a pod transport plate 305 on a support 307, respectively. The load port 301 is used to transfer the semiconductor wafers 209 between the transport pod 201 and the transfer module 113. The load port 301 includes a load port door 303, the pod transport plate 305, and the support 307. The load port door 303 is a movable door through which the semiconductor wafers 209 pass between the transport pod 201 and the transfer module 113. The pod transport plate 305 is movably mounted on the support 307. The pod transport plate 305 is a movable support on which the transport pod 201 is placed. The pod transport plate 305 may be movable between a first position and a second position in a first direction (indicated by the arrows 315 in FIGS. 3B and 3C). In some embodiments, the first position may be a position in which the transport pod 201 may be placed on or removed from the pod transport plate 305. The second position may be a position in which the transport pod 201 is sealed to the load port 301. The second position may be closer to the load port door 303 and the first position may be further from the load port door 303.

The pod transport plate 305 may include nozzles 309, a sensor 311, and registration pins 313. The nozzles 309 are connected to the ports 207 of a transport pod 201 placed on the pod transport plate 305 and may be used, for example, to purge the transport pod 201 using nitrogen gas or the like, as discussed above. The registration pins 313 interface with recesses (not separately illustrated) provided in the transport pod 201, and may be used to align the transport pod 201 on the pod transport plate 305. The registration pins 313 and/or other sensors (not separately illustrated) on the pod transport plate 305 may detect the position of the transport pod 201 on the pod transport plate 305 to ensure the transport pod 201 is properly aligned with the pod transport plate 305 before the pod transport plate 305 is moved from the first position to the second position. The pod transport plate 305 may further include clamps or locks (not separately illustrated) which maintain the position of the transport pod 201 on the pod transport plate 305 while the transport pod 201 is positioned on the pod transport plate 305.

The sensor 311 may include an accelerometer (also referred to as a G sensor or a gravity sensor) or the like and may be used to detect the leveling of the load port 301, vibration of the load port 301, and the like. Although the sensor 311 is illustrated as being disposed on a top surface of the pod transport plate 305 in FIGS. 3A-3C, in various embodiments, the sensor 311 may be disposed on a side surface of the pod transport plate 305, on a surface of the support 307, or in any other suitable position on the load port 301. The sensor 311 detects the leveling and vibration of the load port 301 and provides a warning if either the leveling or the vibration of the load port 301 are outside of a prescribed range. The warning may include an audible alarm, a visual alarm, a phone call, or the like. Data from the sensor 311 may be sent to a computer (not separately illustrated) connected to the load port 301, which may monitor the sensor 311 as well as other sensors included in the load port 301. The load port 301 being unlevel or experiencing excessive vibration can cause damage to and defects in the semiconductor wafers 209 and can result in a drop in device yield. The defects or damage can be caused by contamination of the semiconductor wafers 209 due to improper sealing between the load port 301 and the transport pod 201 or the transfer module 113; bumping of the semiconductor wafers 209 with the transport pod 201, a robotic arm or another transfer mechanism of the semiconductor processing apparatus due to vibration or misalignment, or the like. Including the sensor 311 in the load port 301 can prevent damage and defects to the semiconductor wafers 209 by detecting unleveling and vibration of the load port 301, increasing device yield.

In some embodiments, the sensor 311 may be configured to be directly coupled to the load port 301. For example, the load port 301 may include a socket or a USB cord, which may interface with an edge connector or a USB connector, respectively, of the sensor 311 (each of which is discussed in greater detail below with respect to FIGS. 5A and 5B). The load port 301 may further include a housing (not separately illustrated) configured to hold and protect the sensor 311.

As illustrated in FIG. 3B, the sensor 311 may be positioned on the load port 301 such that indicator lights (discussed in further detail below with respect to FIGS. 5A-6C) on the sensor 311 are visible and are not covered by the transport pod 201 or the like. In embodiments in which the load port 301 includes a housing for the sensor 311, the housing may be configured such that the indicator lights of the sensor are not covered. As such, the indicator lights may be easily visible and may be used to aid in leveling the load port 301.

In some embodiments, the load port 301 may further include a leveling mechanism (not separately illustrated). The leveling mechanism may level the load port 301 or the pod transport plate 305. The leveling mechanism may include leveling jacks, leveling screws, or the like and may be manually actuated or electronically actuated (e.g., actuated through one or more motors). In embodiments in which the leveling mechanism is electronically actuated, the leveling mechanism may be controlled by a load port computer (discussed in greater detail below with respect to FIG. 7) or the sensor 311 based on a level measurement of the sensor 311. Accordingly, the load port 301 may be automatically leveled using the leveling mechanism in conjunction with the sensor 311 and/or the load port computer.

Figure 4:
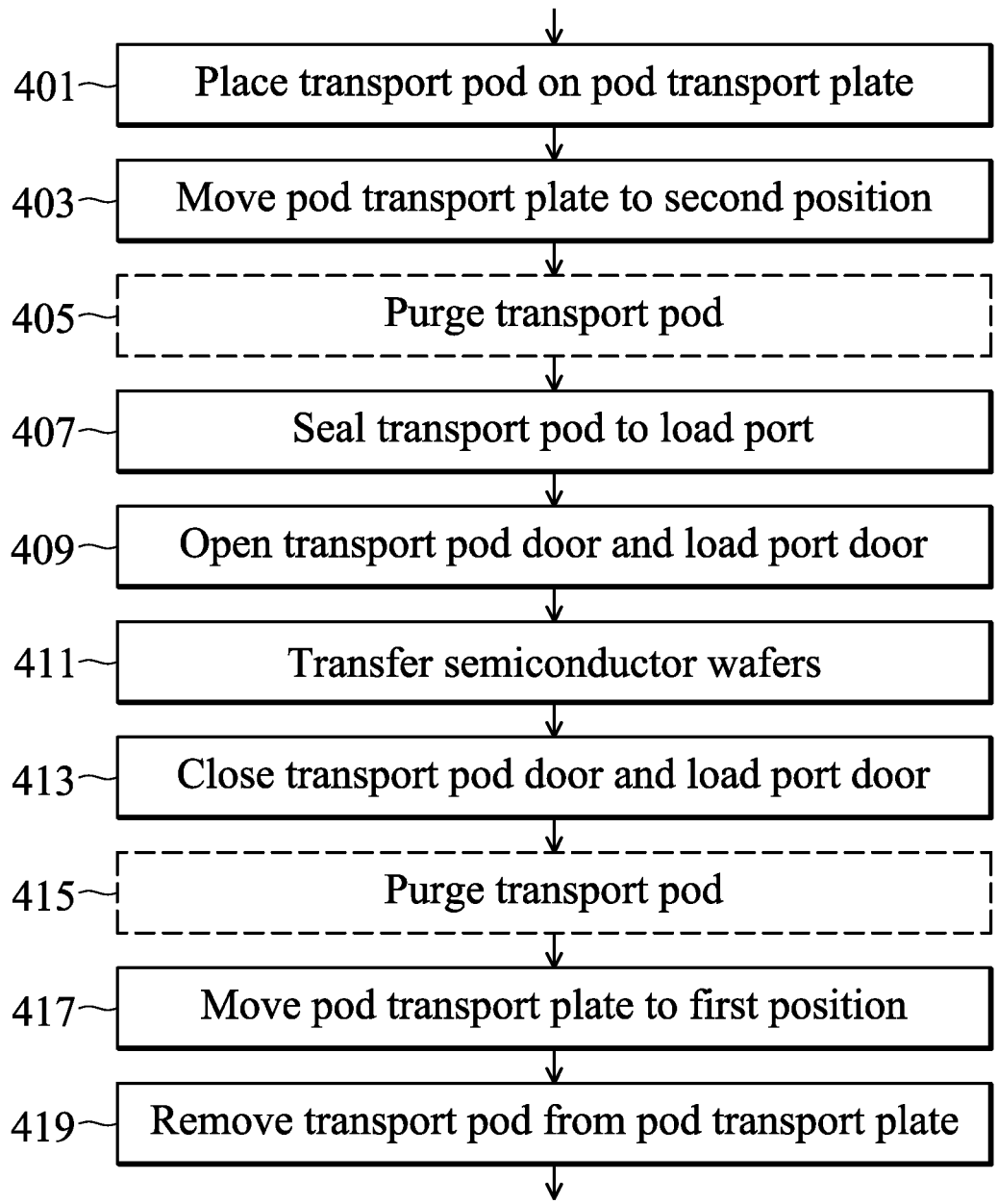
FIG. 4 illustrates a flow diagram of a method for transferring semiconductor wafers between a semiconductor wafer transport pod and a semiconductor processing apparatus using a load port, in accordance with some embodiments.

FIG. 4 illustrates a flow chart of a method of transferring semiconductor wafers between a transport pod and a semiconductor processing apparatus using a load port. In step 401, the transport pod is placed on a pod transport plate of the load port. The transport pod may be aligned on the pod transport plate using a plurality of registration pins or the like. The transport pod may be held in position on the pod transport plate using a plurality of clamps. The transport pod may include a plurality of semiconductor wafers, or the semiconductor wafers may be disposed within the semiconductor processing apparatus. In step 403, the pod transport plate is moved from a first position distal a load port door of the load port to a second position proximal the load port door. In step 405, the transport pod is optionally purged. An inert gas, such as nitrogen gas or the like may be used to purge the transport pod. In step 407, once the pod transport plate reaches the second position, a frame of the transport pod is sealed to the load port. In step 409, the load port door and a transport pod door of the transport pod are opened, allowing access between the interior of the transport pod and a transfer module of the semiconductor processing apparatus.

In step 411, semiconductor wafers are transferred between the transport pod and the transfer module. In some embodiments, the semiconductor wafers may be transferred from the transport pod to the transfer module. The semiconductor wafers may then be transferred between various chambers of the semiconductor processing apparatus and various semiconductor processing steps may be performed on the semiconductor wafers. In some embodiments, the load port door and the transport pod door may be closed after the semiconductor wafers are transferred to the transfer module, while the semiconductor processing steps are performed on the semiconductor wafers. Once the semiconductor processing steps are completed, the semiconductor wafers may be transferred back to the transport pod from the transfer module. In step 413, the transport pod door and the load port door are closed.

In step 415, the transport pod is optionally purged. The purge process may decrease humidity and oxygen in the transport pod, increasing Q-time. In step 417, the pod transport plate is moved from the second position back to the first position. The transport pod is unclamped from the pod transport plate. In step 419, the transport pod is removed from the pod transport plate. The transport pod may then be moved to other semiconductor processing apparatuses for additional processing.

Figure 5B:
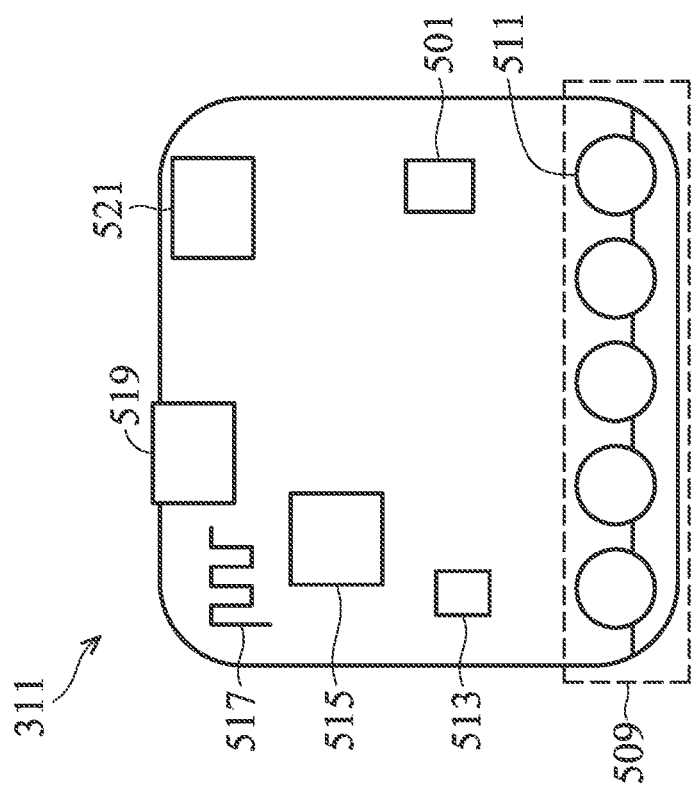
FIGS. 5A and 5B illustrate a front view and a back view of a sensor, in accordance with some embodiments.
Figure 5A:
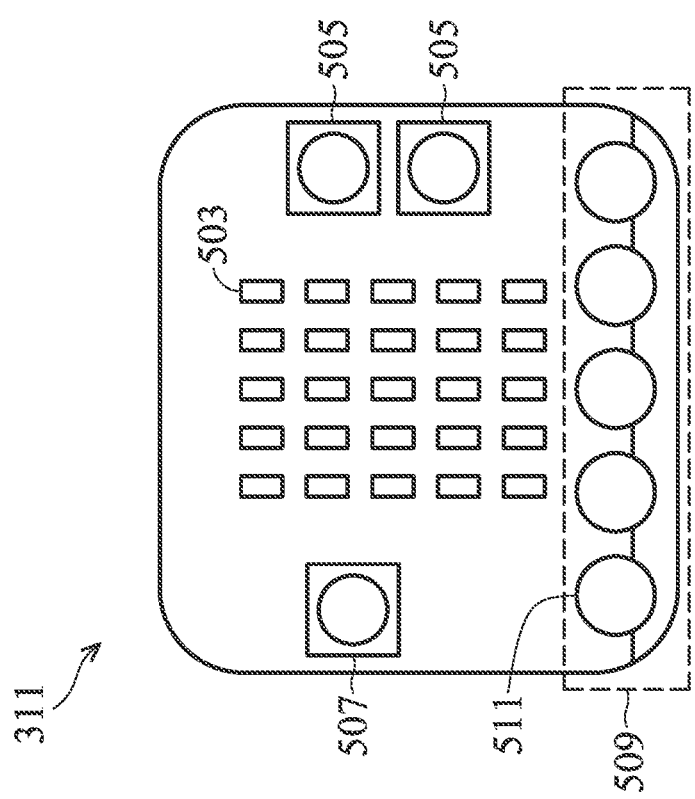

FIGS. 5A and 5B illustrate a front view and a back view of a sensor 311. The sensor 311 may include an accelerometer 501, indicator lights 503, programmable buttons 505, a reset button 507, an edge connector 509, a compass 513, a processor 515, an antenna 517, a USB connector 519, a battery socket 521, and the like. The accelerometer 501 measures movement of the sensor 311 along three axes (e.g., an X-axis, a Y-axis, and a Z-axis) and can measure movement of the sensor 311 along any of the three axes, tilting of the sensor 311 in a latitudinal direction, and tilting of the sensor in a longitudinal direction. The accelerometer 501 may be used to determine a tilt angle of the sensor 311 between 0 and 90 degrees. The accelerometer 501 may also be used to determine the speed and frequency of any movement of the sensor 311 and may thereby be used to track any vibration of the sensor 311. The processor 515 may be used to process data obtained by the accelerometer 501 and other sensors on the sensor 311.

The indicator lights 503 may be used to display the direction and the severity of any unleveling or vibration of the sensor 311 detected by the sensor 311. As such, the indicator lights 503 may be used to adjust the leveling of the load port by showing a user which direction the load port needs to be moved and illustrating when the load port is level. The indicator lights 503 may be LEDs or the like. The indicator lights 503 may be configured to display a warning if the unleveling or the vibration of the sensor 311 exceeds a threshold value. The sensor 311 may further include a speaker, which may also be programmed to sound a warning if the unleveling or the vibration of the sensor 311 exceeds the threshold value. In some embodiments, the sensor 311 may be connected to a laser, and may be programmed to control the laser to provide a warning if the unleveling or the vibration of the sensor 311 exceeds the threshold value. The programmable buttons 505 may be used to turn the sensor 311 on and off, to change between different modes, to set an initial position of the sensor 311, or the like. For example, in one embodiment, the sensor 311 may be placed on the load port 301, then the programmable buttons 505 may be used to set an initial position of the sensor 311. The reset button 507 may reset the sensor 311.

The edge connector 509 may include large pins, which are connected to holes 511 passing through the sensor 311, and small pins. The large pins may be compatible with crocodile clips, banana plugs, and the like. In some embodiments, the edge connector may include about 5 large pins and about 20 small pins; however, any suitable number of pins may be included. The antenna 517 may be configured to communicate via radio, Bluetooth, and the like. For example, the antenna 517 may be configured to communicate with other sensors 311 by radio and with Bluetooth devices by Bluetooth. A battery (not separately illustrated) may be connected to the battery socket 521 to power the various components of the sensor 311. The sensor 311 may also be powered through the edge connector 509 or the USB connector 519. The edge connector 509, the antenna 517, and the USB connector 519 may be configured to provide communication between the processor and external devices, such as a load port computer, a cell phone, and the like. The edge connector 509, the antenna 517, and the USB connector 519 may be collectively referred to as communication modules. In an embodiment, the communication modules may be configured to provide data indicating the leveling and the vibration of the sensor 311 to the load port computer. The communication modules may be further configured to send a warning to a cell phone or the like if the unleveling or the vibration of the sensor 311 exceeds the threshold value.

In various embodiments, a load port computer may be configured to communicate with the sensor 311. The load port computer may be connected to the sensor 311 using the USB connector 519. The load port computer may be used to code and control the sensor 311 using a coding language such as Javascript, Python, Scratch, or the like. The load port computer may be provided with a graphical user interface (GUI) used to control the sensor 311.

In some embodiments, data from the sensor 311 may be sent to a fault detection and classification device (not separately illustrated). The fault detection and classification device may transform data from the sensor 311 into summary statistics and models. The fault detection may analyze the statistics and models against defined limits and provide a warning if the leveling or the vibration of the sensor are outside of the defined limits. For example, if the leveling or vibration of the sensor 311 are outside of the defined limits, the fault detection and classification device may send out a phone call alert, produce an audible alarm, produce visual alarms, combinations thereof, or the like.

Figure 6C:
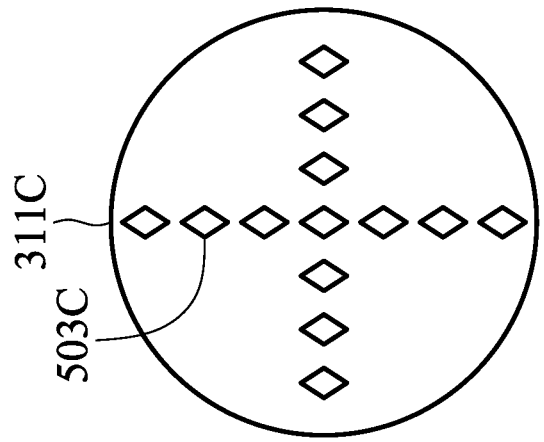
FIGS. 6A-6C illustrate front views of sensors, in accordance with some embodiments.
Figure 6B:
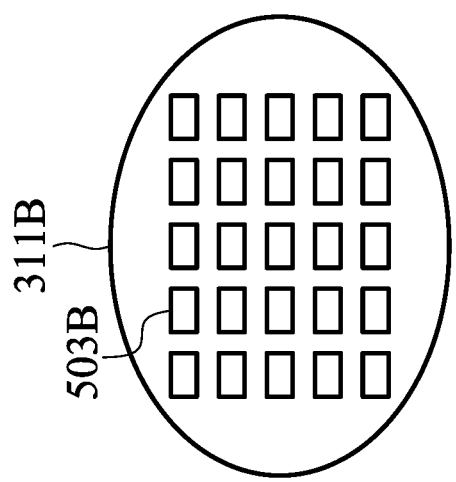
Figure 6A:
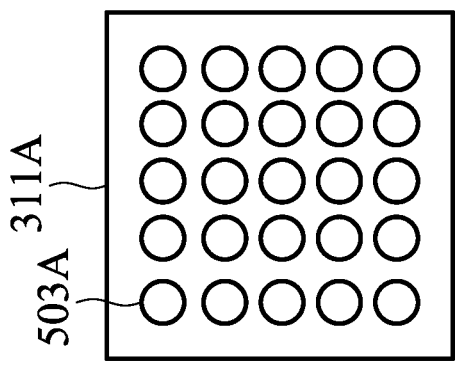

FIGS. 6A-6C illustrate various configurations for the indicator lights 503 on the sensors 311. As illustrated in FIG. 6A, indicator lights 503A may have a circular shape and may be arranged in a 5 by 5 square, and sensor 311A may have a square shape. As illustrated in FIG. 6B, indicator lights 503B may have a rectangular shape and may be arranged in a 5 by 5 rectangle, and sensor 311B may have an oval shape. As illustrated in FIG. 5C, indicator lights 503C may have a diamond shape and may be arranged in a cross with 7 indicator lights arranged along an X-axis and 7 indicator lights arranged along a Y-axis, and sensor 311C may have a circular shape. Any other shape may be used for the indicator lights 503 and the sensor 311 and the indicator lights 503 may be arranged in any suitable shape. For example, the indicator lights 503 may have a circular shape, an oval shape, a square shape, a diamond shape, a rhomboid shape, or the like, and the indicator lights 503 may be points, lines, balls, or the like. The indicator lights 503 may be arranged in a square, a rectangle, a circle, an oval, a diamond, a cross, a T, a line, multiple lines, combinations thereof, or the like. The sensor 311 may have a circular shape, an oval shape, a square shape, a diamond shape, a rhomboid shape, or the like. Any number of indicator lights 503 may be included on the sensor 311. For example, a number of indicator lights 503 arranged along an X-axis of the sensor 311 may range from 1 to 1,000 and a number of indicator lights 503 arranged along a Y-axis of the sensor 311 may range from about 1 to 1,000. The indicator lights 503 may each be separated from neighboring indicator lights 503 by a distance ranging from about 1 mm to about 100 mm. The indicator lights 503 may be arranged between about 1 mm and about 100 mm from side surfaces of the sensor 311. The sensor 311 may have a length of less than about 100 mm or from about 1 mm to about 100 mm, such as about 42 mm; a width of less than about 100 mm or from about 1 mm to about 100 mm, such as about 52 mm; and a height of from about 6 mm to about 18 mm, such as about 12 mm.

The sensor 311 may be configured to detect leveling of the load port 301 in real time. As such, including the sensor 311 on the load port 301 helps to quickly detect any unleveling or excessive vibration of the load port 301 and provide warnings of such conditions. As such, the leveling of the load port 301 can be corrected quickly. Moreover, the sensor 311 may indicate the direction and severity of any unleveling of the load port 301; therefore, the sensor 311 may be used to correct the leveling of the load port 301. Correcting unleveling and excessive vibration of the load port 301 helps to prevent defects in the semiconductor wafers, which may be caused by the excessive vibration, misalignment of the load port, exposure to contamination, and the like, and, thereby, helps to increase device yield.

Figure 7:
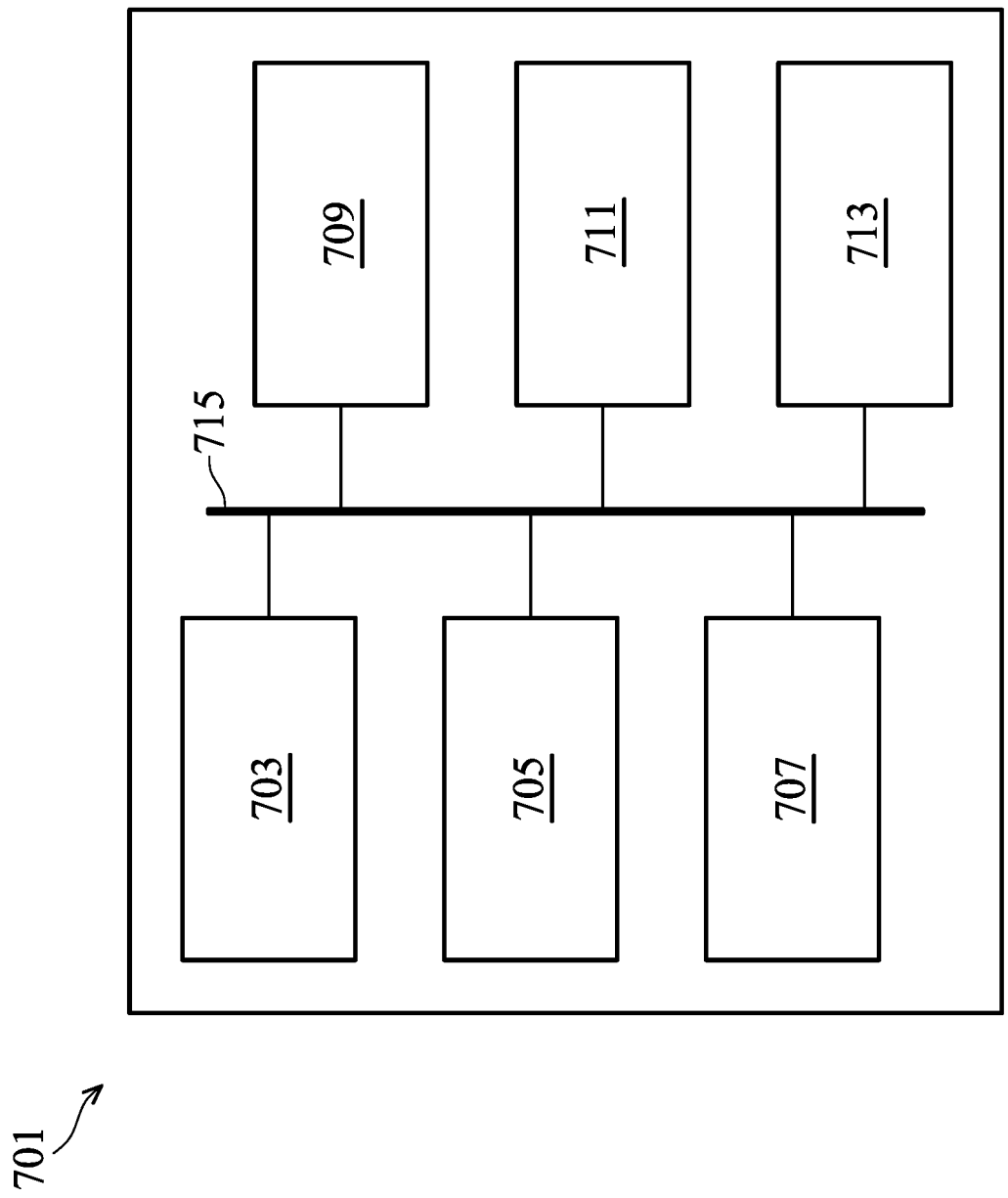
FIG. 7 illustrates a block diagram of a load port computer, in accordance with some embodiments.

FIG. 7 illustrates a block diagram of a load port computer 701 that may be used for implementing the previously described methods and embodiments, in accordance with a representative embodiment. In some embodiments, the load port computer may utilize all of the components shown, or only a subset of the components, and levels of integration may vary from embodiment to embodiment. Furthermore, the load port computer 701 may contain multiple instances of a component, such as multiple processing units, processors, memories, transmitters, receivers, etc.

The load port computer 701 may include a central processing unit (CPU) 703, a storage device 705, a network interface 707, a memory 709, a video adapter 711, and an input/output (I/O) interface 713. The CPU 703, the storage device 705, the network interface 707, the memory 709, the video adapter 711, and the input/output interface 713 may be connected to a bus 715.

The bus 715 may be one or more of any type of several bus architectures including a memory bus or memory controller, a peripheral bus, a video bus, or the like. The CPU 703 may include any type of electronic data processor. The memory 709 may include any type of system memory such as static random access memory (SRAM), dynamic random access memory (DRAM), synchronous DRAM (SDRAM), read-only memory (ROM), a combination thereof, or the like. In an embodiment, the memory 709 may include ROM for use at boot-up, and DRAM for program and data storage for use while executing programs.

The storage device 705 may include any type of storage device configured to store data, programs, and other information and to make the data, programs, and other information accessible via the bus 715. In various embodiments, the storage device 705 may include, for example, one or more of a solid state drive, a hard disk drive, a magnetic disk drive, an optical disk drive, or the like.

The video adapter 711 and the I/O interface 713 provide interfaces to couple external input and output devices to the load port computer 701. In various embodiments, the input and output devices may include a display coupled to the video adapter 711 and a mouse, a keyboard, a speaker, a microphone, a touchscreen, a keypad, a printer, combinations thereof, or the like coupled to the I/O interface 713. In various embodiments, the sensor 311 may be coupled to the I/O interface 713. Other devices may be coupled to the load port computer 701 and additional or fewer interface cards may be utilized. For example, a serial interface card (not separately illustrated) may be used to provide a serial interface for a printer.

The load port computer 701 also includes a network interface 707, which may comprise wired links, such as an Ethernet cable or the like, and/or wireless links to access nodes or different networks. The network interface 707 allows the load port computer 701 to communicate with remote units via the networks. For example, the network interface may provide wireless communication via one or more transmitters/transmit antennas and one or more receivers/receive antennas. In an embodiment, the processing unit is coupled to a local-area network or a wide-area network for data processing and communications with remote devices, such as other processing units, the Internet, remote storage facilities, or the like. In some embodiments, the load port computer 701 may be coupled to the sensor 311 wirelessly through the network interface 707.

The load port computer 701 may be used in conjunction with the sensor 311 to level the load port 301. For example, the sensor 311 may detect an acceleration of the load port using the accelerometer 501. Either the sensor 311 or the load port computer 701 may determine a level measurement of the load port 301 based on the detected acceleration and determine whether the level measurement is within an allowance of level. The load port 301 may then be leveled if the level measurement is outside the allowance.

In accordance with an embodiment, a sensor includes an accelerometer configured to detect leveling and vibration of a load port and produce a plurality of data; a plurality of indicator lights configured to display a level measurement and a level direction based on the leveling of the load port; a processor configured to process the data produced by the accelerometer; and a wired connection configured to connect the processor to an external device. In an embodiment, the indicator lights are arranged in a cross pattern. In an embodiment, the wired connection includes a USB port. In an embodiment, the wired connection includes an edge connector. In an embodiment, the sensor further includes a plurality of programmable buttons configured to program the sensor.

In accordance with another embodiment, a load port includes a pod support configured to hold a semiconductor wafer transport pod; a load port door through which semiconductor wafers are transported; and a load port leveling sensor, the load port leveling sensor configured to measure the leveling of the load port, the load port leveling sensor including a plurality of indicator lights indicating the leveling of the load port, the load port leveling sensor being disposed directly on the pod support. In an embodiment, the pod support is configured to hold a semiconductor wafer transport pod on an uppermost surface thereof, and the load port leveling sensor is disposed on the uppermost surface of the pod support. In an embodiment, the pod support is configured to hold a semiconductor wafer transport pod on an uppermost surface thereof, and the load port leveling sensor is disposed on a side surface of the pod support. In an embodiment, the load port further includes a load port computer, the load port computer being connected to the load port leveling sensor, the load port computer being configured to receive feedback data from the load port leveling sensor indicating the leveling of the load port. In an embodiment, the load port computer is configured to communicate with the load port leveling sensor using Javascript.

In an embodiment, the load port computer is connected to the load port leveling sensor using a wired connection. In an embodiment, the load port leveling sensor has a rectangular shape, and a length and a width of the load port leveling sensor are less than 100 mm.

In accordance with yet another embodiment, a method includes detecting an acceleration of a sensor on a load port using an accelerometer; determining a level measurement of the load port based on the detected acceleration; determining whether the level measurement is within an allowance of level; and leveling the load port if the level measurement is outside the allowance using indicator lights on the sensor as a guide. In an embodiment, the sensor determines the level measurement and determines whether the level measurement is within the allowance. In an embodiment, a computer external to the sensor determines the level measurement and determines whether the level measurement is within the allowance. In an embodiment, the method further includes automatically leveling the load port if the level measurement is outside the allowance using a leveling mechanism. In an embodiment, the method further includes determining a vibration of the load port based on the detected acceleration and leveling the load port if the calculated vibration is greater than a threshold value. In an embodiment, the method further includes sending feedback data from the sensor to a load port computer using a wired connection. In an embodiment, the method further includes sending a phone call alert if the level measurement is outside the tolerance. In an embodiment, the method further includes providing an auditory alarm if the level measurement is outside the tolerance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sensor comprising:
   an accelerometer configured to detect leveling and vibration of a load port and produce a plurality of data;
   a plurality of indicator lights configured to display a level measurement and a level direction based on the leveling of the load port;
   a processor configured to process the data produced by the accelerometer; and
   a wired connection configured to connect the processor to an external device.

2. The sensor of claim 1, wherein the indicator lights are arranged in a cross pattern.

3. The sensor of claim 1, wherein the wired connection comprises a USB port.

4. The sensor of claim 1, wherein the wired connection comprises an edge connector.

5. The sensor of claim 1, further comprising a plurality of programmable buttons configured to program the sensor.

6. A load port comprising:
   a pod support configured to hold a semiconductor wafer transport pod;
   a load port door through which semiconductor wafers are transported; and
   a load port leveling sensor, the load port leveling sensor configured to measure the leveling of the load port, the load port leveling sensor comprising a plurality of indicator lights indicating the leveling of the load port, the load port leveling sensor being disposed directly on the pod support.

7. The load port of claim 6, wherein the pod support is configured to hold the semiconductor wafer transport pod on an uppermost surface thereof, and wherein the load port leveling sensor is disposed on the uppermost surface of the pod support.

8. The load port of claim 6, wherein the pod support is configured to hold the semiconductor wafer transport pod on an uppermost surface thereof, and wherein the load port leveling sensor is disposed on a side surface of the pod support.

9. The load port of claim 6, further comprising a load port computer, the load port computer being connected to the load port leveling sensor, the load port computer being configured to receive feedback data from the load port leveling sensor indicating the leveling of the load port.

10. The load port of claim 9, wherein the load port computer is configured to communicate with the load port leveling sensor using Javascript.

11. The load port of claim 9, wherein the load port computer is connected to the load port leveling sensor using a wired connection.

12. The load port of claim 6, wherein the load port leveling sensor has a rectangular shape, wherein a length and a width of the load port leveling sensor are less than 100 mm.

13. A method comprising:
    detecting an acceleration of a sensor on a load port using an accelerometer;
    determining a level measurement of the load port based on the detected acceleration;
    determining whether the level measurement is within an allowance of level; and
    leveling the load port if the level measurement is outside the allowance using indicator lights on the sensor as a guide.

14. The method of claim 13, wherein the sensor determines the level measurement and determines whether the level measurement is within the allowance.

15. The method of claim 13, wherein a computer external to the sensor determines the level measurement and determines whether the level measurement is within the allowance.

16. The method of claim 13, further comprising determining a vibration of the load port based on the detected acceleration and leveling the load port if the calculated vibration is greater than a threshold value.

17. The method of claim 13, further comprising sending feedback data from the sensor to a load port computer using a wired connection.

18. The method of claim 13, further comprising sending a phone call alert if the level measurement is outside the tolerance.

19. The method of claim 13, further comprising providing an auditory alarm if the level measurement is outside the tolerance.

20. The method of claim 13, further comprising installing the sensor on an exterior of the load port.

* * * * *